United States Patent
Hsieh et al.

(10) Patent No.: US 11,114,555 B2
(45) Date of Patent: Sep. 7, 2021

(54) HIGH ELECTRON MOBILITY TRANSISTOR DEVICE AND METHODS FOR FORMING THE SAME

(71) Applicant: Vanguard International Semiconductor Corporation, Hsinchu (TW)

(72) Inventors: Chi-Feng Hsieh, Taipei (TW); Tuan-Wei Wang, New Taipei (TW); Chien-Jen Sun, Jhubei (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 16/545,230

(22) Filed: Aug. 20, 2019

(65) Prior Publication Data

US 2021/0057562 A1    Feb. 25, 2021

(51) Int. Cl.
 *H01L 29/778* (2006.01)
 *H01L 29/66* (2006.01)
 *H01L 21/02* (2006.01)

(52) U.S. Cl.
 CPC ...... *H01L 29/7787* (2013.01); *H01L 21/0254* (2013.01); *H01L 21/02178* (2013.01); *H01L 21/02458* (2013.01); *H01L 21/02527* (2013.01); *H01L 29/66462* (2013.01)

(58) Field of Classification Search
 CPC ............ H01L 29/66431; H01L 29/778; H01L 29/78687
 See application file for complete search history.

(56) References Cited

U.S. PATENT DOCUMENTS

| | | | |
|---|---|---|---|
| 2015/0372189 A1* | 12/2015 | Matsuura | H01L 33/32 257/13 |
| 2018/0204941 A1* | 7/2018 | Odnoblyudov | H01L 21/0254 |
| 2018/0287014 A1* | 10/2018 | Asada | H01L 33/145 |
| 2018/0323337 A1* | 11/2018 | Dong | H01L 33/007 |
| 2019/0019917 A1* | 1/2019 | Jain | H01L 33/325 |

* cited by examiner

*Primary Examiner* — Jae Lee
(74) *Attorney, Agent, or Firm* — Birch, Stewart, Kolasch & Birch LLP

(57) ABSTRACT

A high electron mobility transistor device includes a substrate, a plurality of pairs of alternating layers, at least one stress-relief layer and a gallium nitride layer. The plurality of pairs of alternating layers is disposed over the substrate, and each pair of alternating layers includes a carbon-doped gallium nitride layer and an undoped gallium nitride layer. The stress-relief layer is disposed between the pairs of alternating layers. The gallium nitride layer is disposed over the alternating layers.

17 Claims, 5 Drawing Sheets

HIGH ELECTRON MOBILITY TRANSISTOR DEVICE AND METHODS FOR FORMING THE SAME

BACKGROUND

Technical Field

The embodiment of the present disclosure relates to semiconductor manufacturing, and in particular it relates to high electron mobility transistor devices and methods for forming the same.

Description of the Related Art

A high electron mobility transistor (HEMT), also known as a heterostructure field-effect transistor (HFET) or a modulation-doped field-effect transistor (MODFET), is a kind of field effect transistor (FET) made of semiconductor materials having different energy gaps. A two-dimensional electron gas (2DEG) layer is formed at the interface between two different semiconductor materials that are adjacent to each other. Due to the high electron mobility of the 2DEG, the HEMT device can have a high breakdown voltage, high electron mobility, low on-resistance, low input capacitance, and other advantages, and is therefore suitable for high-power components.

Doping carbon into the gallium nitride (GaN) layer of the high electron mobility transistor can increase the resistivity of the GaN material to achieve high withstand voltage applications. However, during the process of carbon doping, for example, at low temperatures and low ratio of group V to group III, defects may be introduced to affect the performance of the HEMT devices. Therefore, the existing HEMT devices are not satisfactory in every respect.

BRIEF SUMMARY

In accordance with some embodiments of the present disclosure, a high electron mobility transistor device is provided. The high electron mobility transistor device includes a substrate; a plurality of pairs of alternating layers disposed over the substrate and each pair of alternating layers including a carbon-doped gallium nitride layer and an undoped gallium nitride layer; at least one stress-relief layer disposed between the pairs of alternating layers; and a gallium nitride layer disposed over the alternating layers.

In some embodiments, the stress-relief layer is an aluminum-containing layer.

In some embodiments, the aluminum-containing layer includes aluminum nitride (AlN), aluminum gallium nitride (AlGaN), or a combination thereof.

In some embodiments, the stress-relief layer is disposed between every two pairs of alternating layers.

In some embodiments, the thickness of the stress-relief layer ranges from 0.1 nm to 10 nm.

In some embodiments, the thickness of the carbon-doped gallium nitride layer ranges from 1 nm to 600 nm, and the thickness of the undoped gallium nitride layer ranges from 1 nm to 200 nm.

In some embodiments, the ratio of the thickness of the carbon-doped gallium nitride layer to the thickness of the undoped gallium nitride layer ranges from 3.5 to 5.

In some embodiments, the high electron mobility transistor device further includes a nucleation layer disposed between the substrate and the plurality of pairs of alternating layers.

In some embodiments, the nucleation layer includes aluminum nitride (AlN), aluminum gallium nitride (AlGaN), or a combination thereof.

In some embodiments, the high electron mobility transistor device further includes a buffer layer disposed between the substrate and the plurality of pairs of alternating layers.

In some embodiments, the buffer layer includes gallium nitride (GaN), aluminum nitride (AlN), aluminum gallium nitride (AlGaN), or a combination thereof.

In some embodiments, the buffer layer includes a gradient buffer layer, a superlattice buffer layer, or a combination thereof.

In some embodiments, the high electron mobility transistor device further includes a barrier layer disposed over the gallium nitride layer; and a source, a drain, and a gate disposed over the barrier layer.

In accordance with another embodiment of the present disclosure, a method for forming high electron mobility transistor devices is provided. The method includes forming a substrate; forming a plurality of pairs of alternating layers over the substrate, wherein each pair of alternating layers includes a carbon-doped gallium nitride layer and an undoped gallium nitride layer; forming at least one stress-relief layer between the pairs of alternating layers; and forming a gallium nitride layer over the alternating layers.

In some embodiments, the plurality of pairs of alternating layers includes aluminum nitride, aluminum gallium nitride, or a combination thereof, and the stress-relief layer includes aluminum nitride, aluminum gallium nitride, or a combination thereof.

In some embodiments, the method further includes forming the stress-relief layer between every two pairs of alternating layers.

In some embodiments, the thickness of the stress-relief layer ranges from 0.1 nm to 10 nm.

In some embodiments, the thickness of the carbon-doped gallium nitride layer ranges from 1 nm to 600 nm, the thickness of the undoped gallium nitride layer ranges from 1 nm to 200 nm, and the ratio of the thickness of the carbon-doped gallium nitride layer to the thickness of the undoped gallium nitride layer ranges from 3.5 to 5.

In some embodiments, the method further includes forming a nucleation layer between the substrate and the plurality of pairs of alternating layers, wherein the nucleation layer includes aluminum nitride, aluminum gallium nitride, or a combination thereof.

In some embodiments, the method further includes forming a buffer layer between the substrate and the plurality of pairs of alternating layers, wherein the buffer layer includes a gradient buffer layer, a superlattice buffer layer, or a combination thereof.

BRIEF DESCRIPTION OF THE DRAWINGS

The disclosure can be more fully understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

The following outlines several embodiments so that those skilled in the art may better understand the present disclosure. However, these embodiments are examples only and are not intended to limit the present disclosure. It is understandable that those skilled in the art may adjust the embodiments described below according to requirements, for example, changing the order of processes and/or including more or fewer steps than described herein. Furthermore, other elements may be added on the basis of the embodiments described below. For example, the description of "forming a second element on a first element" may include embodiments in which the first element is in direct contact with the second element, and may also include embodiments in which additional elements are disposed between the first element and the second element such that the first element and the second element are not in direct contact, and spatially relative descriptors of the first element and the second element may change as the device is operated or used in different orientations.

In accordance with some embodiments of the present disclosure, an alternating layer including a carbon-doped gallium nitride layer and an undoped gallium nitride layer disposed in a high electron mobility transistor (HEMT) device is described, which improves withstand voltage while increasing crystalline quality. In addition, at least one stress-relief layer is disposed over the alternating layers to relieve stress, thereby increasing the number and thicknesses of the alternating layers, so that the HEMT device can achieve a higher withstand voltage.

Figure 1A:
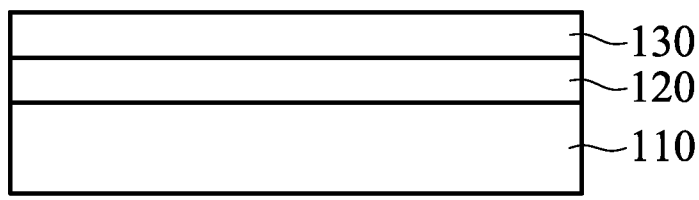
FIGS. 1A-1E are cross-sectional views illustrating a high electron mobility transistor device at various stages of manufacture in accordance with some embodiments.

FIGS. 1A-1E are cross-sectional views illustrating a high electron mobility transistor (HEMT) device 1000 at various stages of manufacture in accordance with some embodiments. As illustrated in FIG. 1A, the HEMT device 1000 includes a substrate 110. The substrate 110 may be a bulk semiconductor substrate or a composite substrate formed of different materials. The substrate 110 may include any substrate materials suitable for semiconductor devices, such as silicon, germanium, silicon carbide, gallium nitride (GaN), and/or sapphire.

In some embodiments, a nucleation layer 120 is formed over the substrate 110 to relieve the lattice mismatch between the substrate 110 and layers grown thereon. For example, the nucleation layer 120 may include aluminum nitride (AlN), aluminum gallium nitride (AlGaN), the like, or a combination thereof, and a thickness of the nucleation layer 120 may range from about 100 nanometers (nm) to about 1000 nm, such as about 200 nm. The nucleation layer 120 may be formed by a deposition process, such as metal organic chemical vapor deposition (MOCVD), molecular beam epitaxy (MBE), liquid phase epitaxy (LPE), or another deposition process.

In some embodiments, a buffer layer 130 is formed over the nucleation layer 120 to relieve the lattice mismatch between different layers. The nucleation layer 120 is optional. In other embodiments, the buffer layer 130 may be formed directly on the substrate without providing the nucleation layer 120. In some embodiments, the buffer layer 130 may include a group III nitride, such as GaN, AlN, AlGaN, the like, or a combination thereof, and the thickness of the buffer layer 130 may range from about 0.1 micrometer (μm) to about 10 μm, such as about 0.3 μm. In some embodiments, the buffer layer 130 may be formed by a deposition process, such as MOCVD, MBE, LPE, the like, or a combination thereof.

Figure 1B:
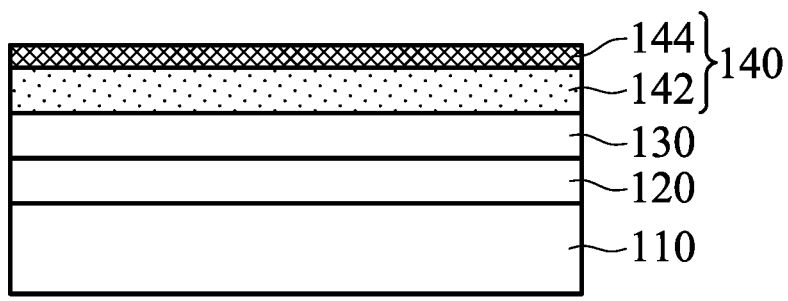

Then, as illustrated in FIG. 1B, alternating layers 140 are formed over the buffer layer 130. The alternating layers 140 include a carbon-doped gallium nitride (CGaN) layer 142 and an undoped gallium nitride (uGaN) 144. Doping carbon into the GaN layer to form the CGaN layer 142 can increase the resistivity and enable the HEMT device 1000 to achieve high withstand voltage applications. In some embodiments, the CGaN 142 has a carbon concentration ranging from about $10^{18}$ to about $10^{22}$ per cubic centimeter. During the process of doping carbon, in order to make the carbon easy to enter the GaN layer, the GaN layer may be grown at a low temperature and at a low ratio of group V to group III. However, the above-mentioned grown conditions are liable to cause problems such as poor crystalline quality and surface roughness. The above-mentioned problems are more remarkable as the thickness of the CGaN layer increases, thereby affecting the performance of the HEMT devices, such as affecting the characteristics of the two-dimensional electron gas.

In this regard, the uGaN layer 144 is formed over the CGaN layer 142 to improve the rough surface of the CGaN layer 142, and the crystalline quality of the entire GaN layer can be maintained and the GaN layer can have a less rough surface while increasing the thickness of the CGaN layer 142. In other words, forming the uGaN layer 144 over the CGaN layer 142 can maintain the performance of the HEMT device 1000, such as the characteristics of the two-dimensional electron gas, and can further increase the withstand voltage.

The number of alternating layers 140 may be adjusted as desired, for example, forming fourteen pairs of alternating layers 140, wherein each pair of alternating layers 140 includes a CGaN layer 142 and a uGaN layer 144.

In some embodiments, the CGaN layer 142 and the uGaN layer 144 may be formed by a deposition process, such as MOCVD, MBE, LPE or another deposition process. The thickness of the CGaN layer 142 may range from about 1 nm to about 600 nm, such as about 500 nm. The thickness of the uGaN layer 144 may range from about 1 nm to about 200 nm, such as about 125 nm. The ratio of the thickness of the CGaN layer 142 to the thickness of the uGaN layer 144 may range from about 3.5 to about 5, such as about 4.

The crystalline quality and surface roughness of the CGaN layer 142 can be better compensated for by having a thicker uGaN layer 144: That is, there is a low ratio of thickness of the CGaN layer 142 to thickness of the uGaN layer 144. On the other hand, the withstand voltage can have better characteristics with a thicker CGaN layer 142: That is, there is a high ratio of thickness of the CGaN layer 142 to thickness of the uGaN layer 144. The ratio of thickness of the CGaN layer 142 to thickness of the uGaN layer 144 may be adjusted as desired.

Figure 1C:
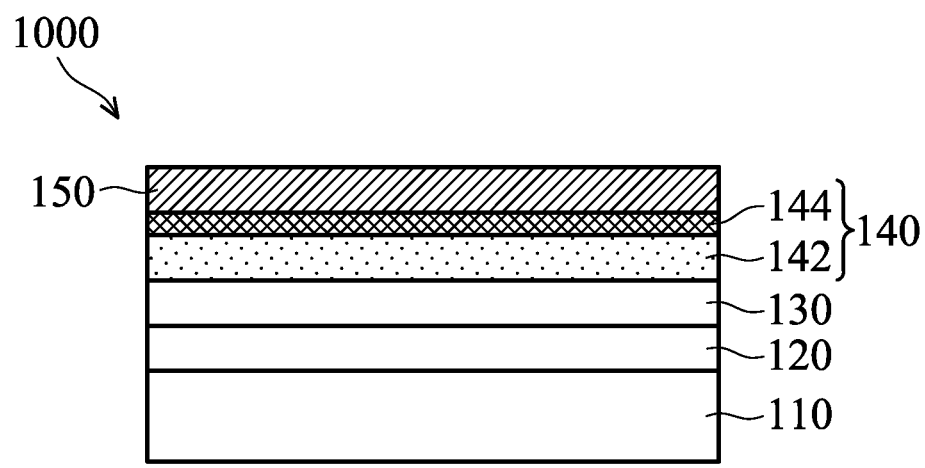

As illustrated in FIG. 1C, at least one stress-relief layer 150 is formed on the alternating layer 140. In some embodiments, the stress-relief layer 150 may be an aluminum-containing layer, such as AlN, AlGaN, or a combination thereof, and the thickness of the stress-relief layer 150 may range from about 0.1 nm to about 10 nm, such as about 1 nm. The stress-relief layer 150 may be formed by a deposition process, such as MOCVD, MBE, LPE, or another deposition process.

As described above, a plurality of pairs of alternating layers 140 may be disposed as desired. However, since coefficients of thermal expansion of the alternating layers 140 and the substrate 110 are different, as the number and thickness of the alternating layers 140 increase, the stress generated becomes greater, and resulting in problem of bow, crack and thickness unevenness, which limits the number of alternating layers 140 that can be disposed. In the present disclosure, the stress-relief layer 150 disposed on the alternating layer 140 can relieve the stress of the alternating layer 140, so that the number and thickness of the alternating layers 140 can be increased, so that the HEMT device 1000 can achieve a higher withstand voltage.

Figure 1D:
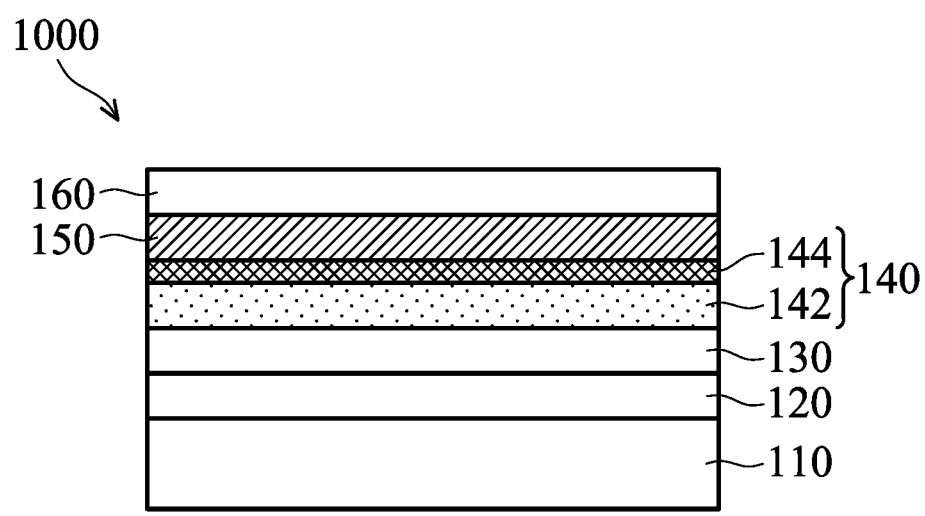
Figure 1E:
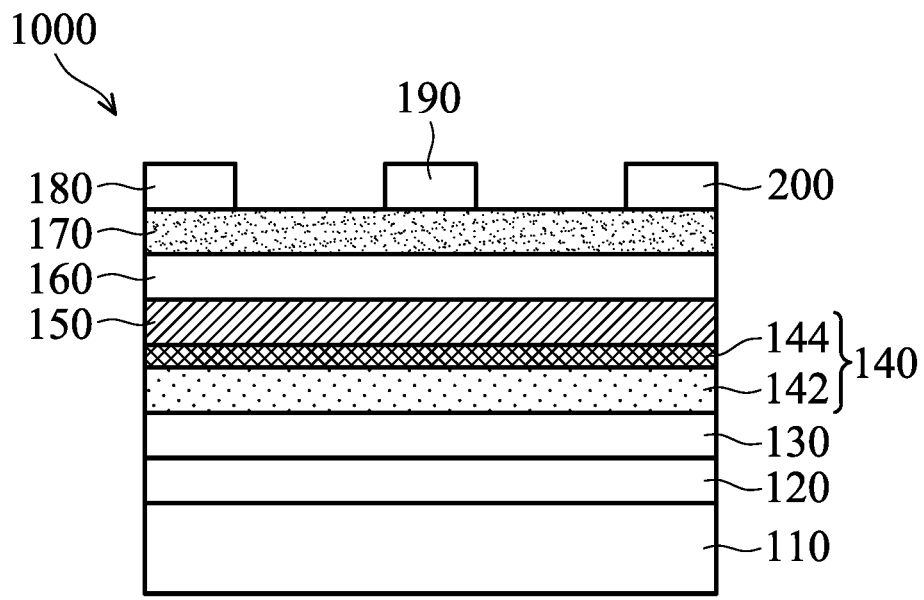

Then, as illustrated in FIG. 1D, a gallium nitride (GaN) layer 160 is formed over the stress-relief layer 150, in accordance with some embodiments. The GaN layer 160 has a better crystalline quality and can provide a flat surface for forming other elements. The GaN layer 160 may be formed by a deposition process, such as MOCVD, MBE, LPE, or another deposition process. The thickness of the GaN layer 160 may be selected as desired. In some embodiments, the GaN layer 160 has a thickness ranging from about 10 nm to about 1 μm, such as about 0.5 μm.

Then, a barrier layer 170 is formed over the GaN layer 160. The barrier layer 170 may be formed by a deposition process, such as MOCVD, MBE, LPE, or another deposition process. In some embodiments, the barrier layer 170 may include a group III nitride, such as a group III-V compound semiconductor material. The barrier layer 170 may include a single layer or a multilayer structure. For example, the barrier layer 170 may include AN, AlGaN, AlInN, AlGaInN, the like, or a combination thereof. The barrier layer 170 may be doped or undoped. The material of the barrier layer 170 may be chosen to create a 2DEG at the interface between the GaN layer 160 and the barrier layer 170.

Then, a source 180, a gate 190, and a drain 200 are disposed over the barrier layer 170 to form the HEMT device 1000, in accordance with some embodiments. The source 180, the gate 190, and the drain 200 may be formed by using any suitable material, process, and sequence, and the spacing and location may be adjusted as desired. In the embodiment illustrated in FIG. 1E, the source 180, the gate 190, and the drain 200 are located on the barrier layer 170, but the disclosure is not limited thereto.

Figure 2:
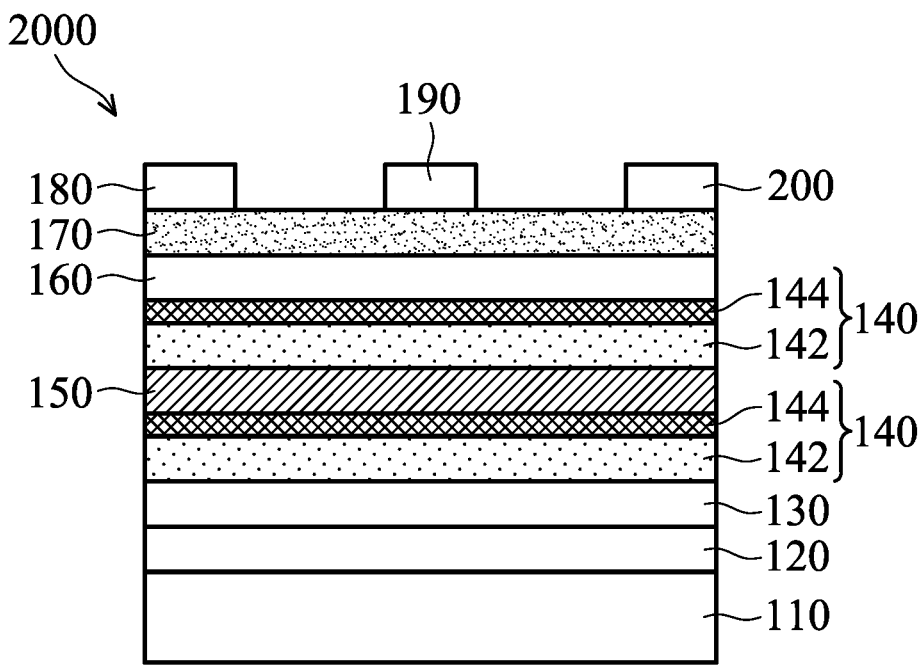
FIGS. 2-4 are cross-sectional views illustrating high electron mobility transistor devices in accordance with another embodiments.
Figure 3:
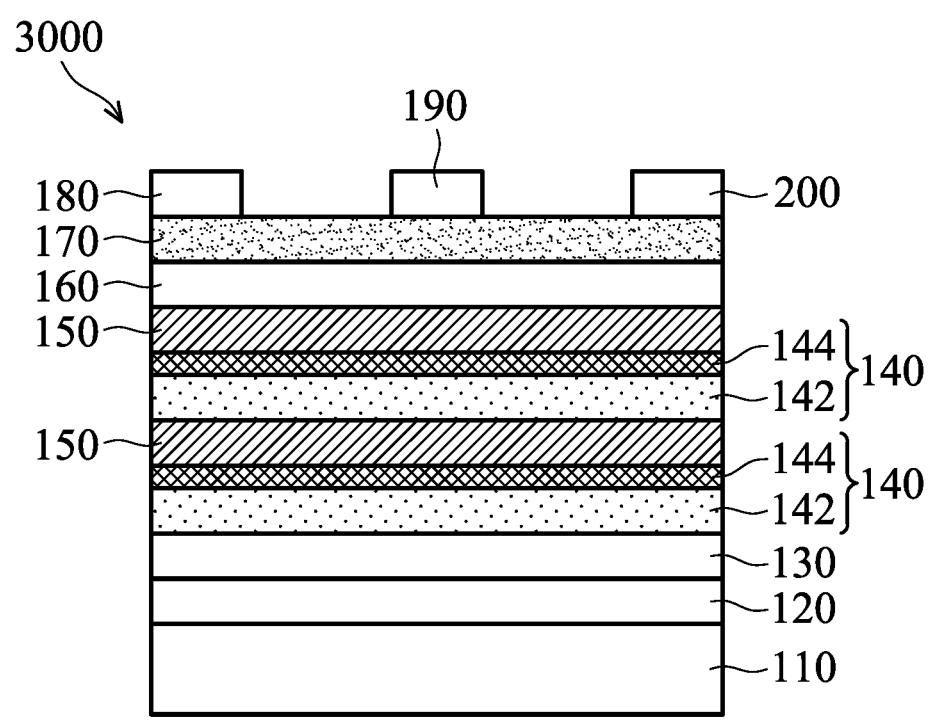
Figure 4:
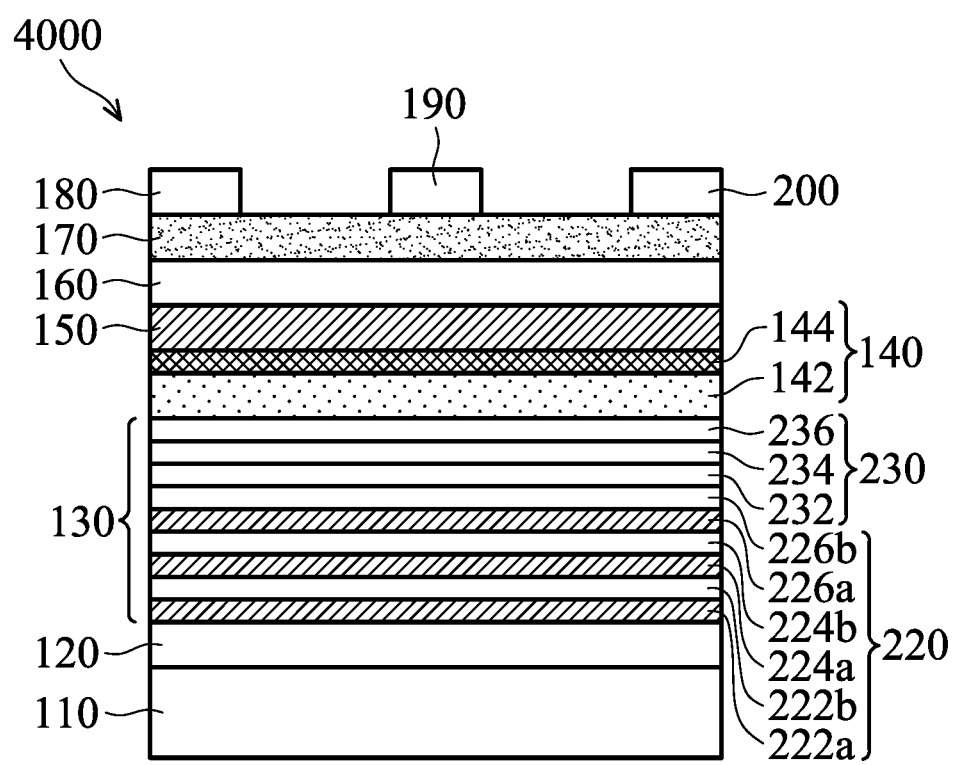

Furthermore, the number and configuration of the stress-relief layer 150 and the alternating layers 140 may be adjusted as desired. FIGS. 2-4 are cross-sectional views illustrating high electron mobility transistor (HEMT) devices, in accordance with some other embodiments. According to some embodiments, as illustrated in FIG. 2, in a HEMT device 2000, the stress-relief layer 150 is disposed between two pairs of alternating layers 140, and then the GaN layer 160 is disposed over the alternating layer 140 and contacts the GaN layer 160. Although not illustrated in the figures, a plurality of pairs of alternating layers 140 and a plurality of stress-relief layers 150 may be disposed between the pairs of alternating layers 140 and the GaN layer 160 of the HEMT device 2000, in accordance with some embodiments. The plurality of stress-relief layers 150 may be disposed above every pair of alternating layers 140 or may be disposed between particular pairs of alternating layers 140 only. The plurality of stress-relief layers 150 may have the same or different thickness as desired.

Furthermore, as illustrated in FIG. 3, in a HEMT device 3000, two stress-relief layers 150 are respectively disposed over the two pairs of alternating layers 140, and the GaN layer 160 is disposed over the stress-relief layer 150, in accordance with some other embodiments. Although not illustrated in the figures, a plurality of pairs of alternating layers 140 and a plurality of stress-relief layers 150 may be disposed between the stress-relief layer 150 and the GaN layer 160 in the HEMT 3000, in accordance with some embodiments. The plurality of stress-relief layers 150 may be disposed above every pair of alternating layers 140 or may be disposed between particular pairs of alternating layers 140 only. The plurality of stress-relief layers 150 may have the same or different thicknesses as desired.

In addition, as illustrated in FIG. 4, the buffer layer 130 of the HEMT 4000 may include a gradient buffer layer, a superlattice buffer layer, a similar buffer layer, or a combination thereof, in accordance with another embodiment. Although FIG. 4 illustrates that the buffer layer 130 includes the superlattice buffer layer 220 and the gradient buffer layer 230, the buffer layer 130 may include the superlattice buffer layer 220 or the gradient buffer layer 230 only.

In some embodiments, the superlattice buffer layer 220 includes a plurality of sets of layers with different concentrations, each set of layers includes a plurality of pairs of AlN layers and AlGaN layers. For example, as illustrated in FIG. 4, the superlattice buffer layer 220 includes a first group of layers including an AlGaN layer 222a and an AlN layer 222b, a second group of layers including an AlGaN layer 224a and an AlN layer 224b, and a third group of layers including an AlGaN layer 226a and an AlN layer 226b, but the present disclosure is not limited thereto. The superlattice buffer layer 220 may include more groups of layers and/or more pairs of AlN layers and AlGaN layers. The superlattice buffer layer 220 may be formed by a deposition process, such as MOCVD, MBE, LPE, or another deposition process. In the superlattice buffer layer 220, each pair of AlGaN layers and AlN layers may have the same or different thickness and aluminum concentration of the AlGaN layers as the other pairs of AlGaN layers and AlN layers as desired.

In some embodiments, the gradient buffer layer 230 includes a plurality of AlGaN layers with different concentrations. For example, as illustrated in FIG. 4, the gradient buffer layer 230 includes three AlGaN layers 232, 234, and 236, but the present disclosure is not limited thereto, and more or fewer AlGaN layers may be disposed. The gradient buffer layer 230 may be formed by a deposition process, such as MOCVD, MBE, LPE, or another deposition process. Each of the AlGaN layers of the gradient buffer layer 230 may have the same or different thickness and aluminum concentration, as desired.

As illustrated in FIG. 4, a buffer layer 130 that includes a superlattice buffer layer 220 and a gradient buffer layer 230 is disposed to relieve the stress of the alternating layers 140 disposed above the buffer layer 130, thereby increasing the thickness of the alternating layer 140 and preventing cracks. Furthermore, at the same thickness, forming a buffer layer 130 that includes a superlattice buffer layer 220 and a gradient buffer layer 230 can significantly shorten the growth time compared to the formation of the superlattice buffer layer 220 only. In addition, forming a buffer layer 130 that includes a superlattice buffer layer 220 and a gradient buffer layer 230 may form an alternating layer 140 with better crystalline quality than when forming the gradient buffer layer 230 only. Therefore, the performance and yield of the HEMT device can be improved while increasing productivity.

Subsequently, referring to the above-mentioned methods, materials and configurations, a plurality of pairs of alternating layers 140 and at least one stress-relief layer 150 are disposed over the gradient buffer layer 230, and then a GaN layer 160 is disposed. A barrier layer 170, a source 180, a gate 190, and a drain 200 are then disposed to form the HEMT 4000.

In summary, in accordance with some embodiments of the present disclosure, providing an undoped gallium nitride layer over a carbon-doped gallium nitride layer can improve the crystalline quality of the carbon-doped gallium nitride layer and surface roughness. Therefore, the performance of the high electron mobility transistor device, such as characteristics of the two-dimensional electron gas, can be maintained and the withstand voltage of the device can be increased.

Furthermore, in accordance with some embodiments of the present disclosure, providing a stress-relief layer over alternating layers including a carbon-doped gallium nitride layer and an undoped gallium nitride layer can relieve stress of disposing the alternating layers, and thereby increasing the number and thickness of the alternating layers to achieve a higher withstand voltage for the high electron mobility transistor devices.

In addition, in accordance with to some embodiments of the present disclosure, providing a buffer layer including a gradient buffer layer and a superlattice buffer layer above the substrate can relieve the stress of the alternating layers disposed above the buffer layer, thereby avoiding cracks or bow, and thereby increasing thickness of the alternating layers. In addition, providing the buffer layer including the gradient buffer layer and the superlattice buffer layer can improve the performance and yield of the high electron mobility transistor devices while improving the productivity as compared with forming the superlattice buffer layer or the graded buffer layer only.

While the present disclosure has been described above by various embodiments, these embodiments are not intended to limit the present disclosure. Those skilled in the art should appreciate that they may make various changes, substitutions and alterations based on the embodiments of the present disclosure to realize the same purposes and/or advantages as the various embodiments described herein. Those skilled in the art should also appreciate that such design or modification practiced does not depart from the spirit and scope of the disclosure. Therefore, the scope of protection of the present disclosure is defined as the subject matter set forth in the appended claims.

What is claimed is:

1. A high electron mobility transistor device, comprising:
a substrate;
a buffer layer disposed over the substrate, wherein the buffer layer comprises a gradient buffer layer disposed over a superlattice buffer layer, and wherein the superlattice buffer layer comprises a plurality of pairs of AlN layers and AlGaN layers, the gradient buffer layer comprises a plurality of AlGaN layers with different concentrations, and one of the plurality of AlGaN layers of the gradient buffer layer is in contact with one of the AlN layers of the superlattice buffer layer;
a plurality of pairs of alternating layers disposed over the substrate buffer layer, wherein each pair of alternating layers comprises a carbon-doped gallium nitride layer and an undoped gallium nitride layer, and a topmost layer of the pairs of alternating layers is a topmost undoped gallium nitride layer;
a stress-relief layer disposed over the topmost undoped gallium nitride layer;
a gallium nitride layer disposed over the stress-relief layer, wherein the stress-relief layer is in contact with the gallium nitride layer and the topmost undoped gallium nitride layer; and
a barrier layer disposed over the gallium nitride layer, wherein a 2DEG is created at the interface between the gallium nitride layer and the barrier layer.

2. The high electron mobility transistor device as claimed in claim 1, wherein the stress-relief layer is an aluminum-containing layer.

3. The high electron mobility transistor device as claimed in claim 2, wherein the aluminum-containing layer comprises aluminum nitride (AlN), aluminum gallium nitride (AlGaN), or a combination thereof.

4. The high electron mobility transistor device as claimed in claim 1, further comprising another stress-relief layer disposed between every two pairs of alternating layers.

5. The high electron mobility transistor device as claimed in claim 1, wherein a thickness of the stress-relief layer ranges from 0.1 nm to 10 nm.

6. The high electron mobility transistor device as claimed in claim 1, wherein a thickness of the carbon-doped gallium nitride layer ranges from 1 nm to 600 nm, and a thickness of the undoped gallium nitride layer ranges from 1 nm to 200 nm.

7. The high electron mobility transistor device as claimed in claim 1, wherein a ratio of a thickness of the carbon-doped gallium nitride layer to a thickness of the undoped gallium nitride layer ranges from 3.5 to 5.

8. The high electron mobility transistor device as claimed in claim 1, further comprising a nucleation layer disposed between the substrate and the plurality of pairs of alternating layers.

9. The high electron mobility transistor device as claimed in claim 8, wherein the nucleation layer comprises aluminum nitride (AlN), aluminum gallium nitride (AlGaN), or a combination thereof.

10. The high electron mobility transistor device as claimed in claim 1, wherein the buffer layer comprises gallium nitride (GaN), aluminum nitride (AlN), aluminum gallium nitride (AlGaN), or a combination thereof.

11. The high electron mobility transistor device as claimed in claim 1, further comprising:
a source, a drain, and a gate disposed over the barrier layer.

12. A method for forming high electron mobility transistor devices, comprising:
forming a substrate;
forming a buffer layer over the substrate, wherein the buffer layer comprises a gradient buffer layer formed over a superlattice buffer layer, and wherein the superlattice buffer layer comprises a plurality of pairs of AlN layers and AlGaN layers, the gradient buffer layer comprises a plurality of AlGaN layers with different concentrations, and one of the plurality of AlGaN layers of the gradient buffer layer is in contact with one of the AlN layers of the superlattice buffer layer;
forming a plurality of pairs of alternating layers over the buffer layer, wherein each pair of alternating layers comprises a carbon-doped gallium nitride layer and an undoped gallium nitride layer, and a topmost layer of the pairs of alternating layers is a topmost undoped gallium nitride layer;
forming a stress-relief layer over the topmost undoped gallium nitride layer;
forming a gallium nitride layer over the stress-relief layer, wherein the stress-relief layer is in contact with the gallium nitride layer and the topmost undoped gallium nitride layer; and forming a barrier layer disposed over the gallium nitride layer, wherein a 2DEG is created at the interface between the gallium nitride layer and the barrier layer.

13. The method as claimed in claim 12, wherein the plurality of pairs of alternating layers comprises aluminum nitride, aluminum gallium nitride, or a combination thereof, and the stress-relief layer comprises aluminum nitride, aluminum gallium nitride, or a combination thereof.

14. The method as claimed in claim 12, further comprising forming another stress-relief layer between every two pairs of alternating layers.

15. The method as claimed in claim 12, wherein a thickness of the stress-relief layer ranges from 0.1 nm to 10 nm.

16. The method as claimed in claim 12, wherein a thickness of the carbon-doped gallium nitride layer ranges from 1 nm to 600 nm, a thickness of the undoped gallium nitride layer ranges from 1 nm to 200 nm, and a ratio of the thickness of the carbon-doped gallium nitride layer to the thickness of the undoped gallium nitride layer ranges from 3.5 to 5.

17. The method as claimed in claim 12, further comprising forming a nucleation layer between the substrate and the plurality of pairs of alternating layers, wherein the nucleation layer comprises aluminum nitride, aluminum gallium nitride, or a combination thereof.

\* \* \* \* \*